(12) United States Patent
Fibranz

(10) Patent No.: US 6,693,846 B2
(45) Date of Patent: Feb. 17, 2004

(54) COMMAND CONTROLLER FOR AN INTEGRATED CIRCUIT MEMORY DEVICE AND TEST CIRCUITRY THEREOF

(75) Inventor: Heiko Fibranz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/446,995

(22) Filed: May 27, 2003

(65) Prior Publication Data

US 2003/0218929 A1 Nov. 27, 2003

(30) Foreign Application Priority Data

May 24, 2002 (DE) .......................... 102 23 178

(51) Int. Cl.[7] ................................ G11C 8/18
(52) U.S. Cl. ................. 365/233; 365/194; 365/201
(58) Field of Search ................ 365/233, 233.5, 365/194, 195, 201

(56) References Cited

U.S. PATENT DOCUMENTS

| 4,575,815 A | 3/1986 | Delahunt | 711/167 |
|---|---|---|---|
| 6,237,119 B1 | 5/2001 | Weber | 714/724 |
| 6,434,062 B2 * | 8/2002 | Lee | 365/194 |
| 6,490,212 B1 * | 12/2002 | Nguyen et al. | 365/207 |
| 6,532,188 B2 * | 3/2003 | Dietrich et al. | 365/233 |
| 6,618,313 B2 * | 9/2003 | Nguyen et al. | 365/227 |

FOREIGN PATENT DOCUMENTS

| DE | 33 33 862 A1 | 4/1984 | G11C/8/00 |

* cited by examiner

Primary Examiner—Andrew Q. Tran
(74) Attorney, Agent, or Firm—Laurence A. Greenberg; Werner H. Stemer; Ralph E. Locher

(57) ABSTRACT

A circuit configuration contains a flow controller that can be put into a plurality of states and outputs a respective command, in a respective one of the states, to a circuit component to be controlled. The flow controller has at least one asynchronously operating delay circuit via which the flow controller moves from one of the states into the respective next state. The delay circuit has a further signal path connected in parallel with it which contains a clock-controlled multivibrator. The delay circuit and the further signal path are able to be operated alternatively using a switching device. The circuit allows, particularly in integrated memories, an asynchronous access command sequence, in a first mode, and a synchronous access command sequence, in a second mode, to be produced for the flow controller, particularly in communication with a test unit.

8 Claims, 3 Drawing Sheets

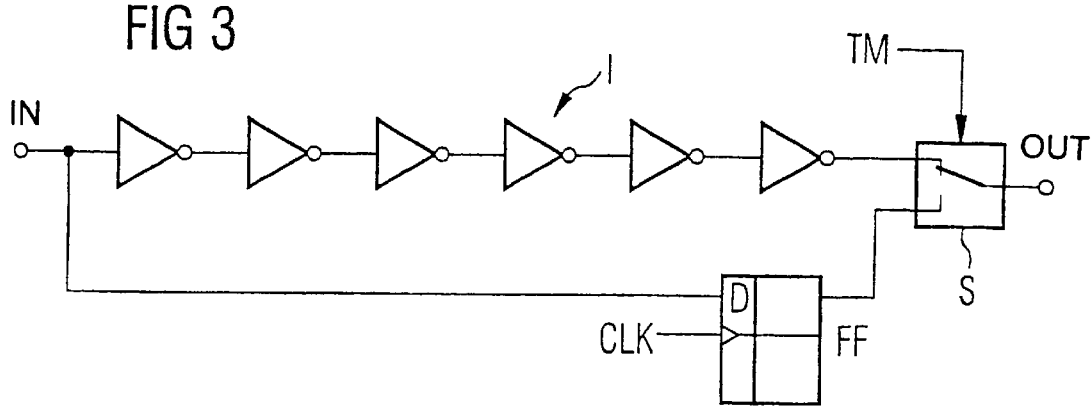
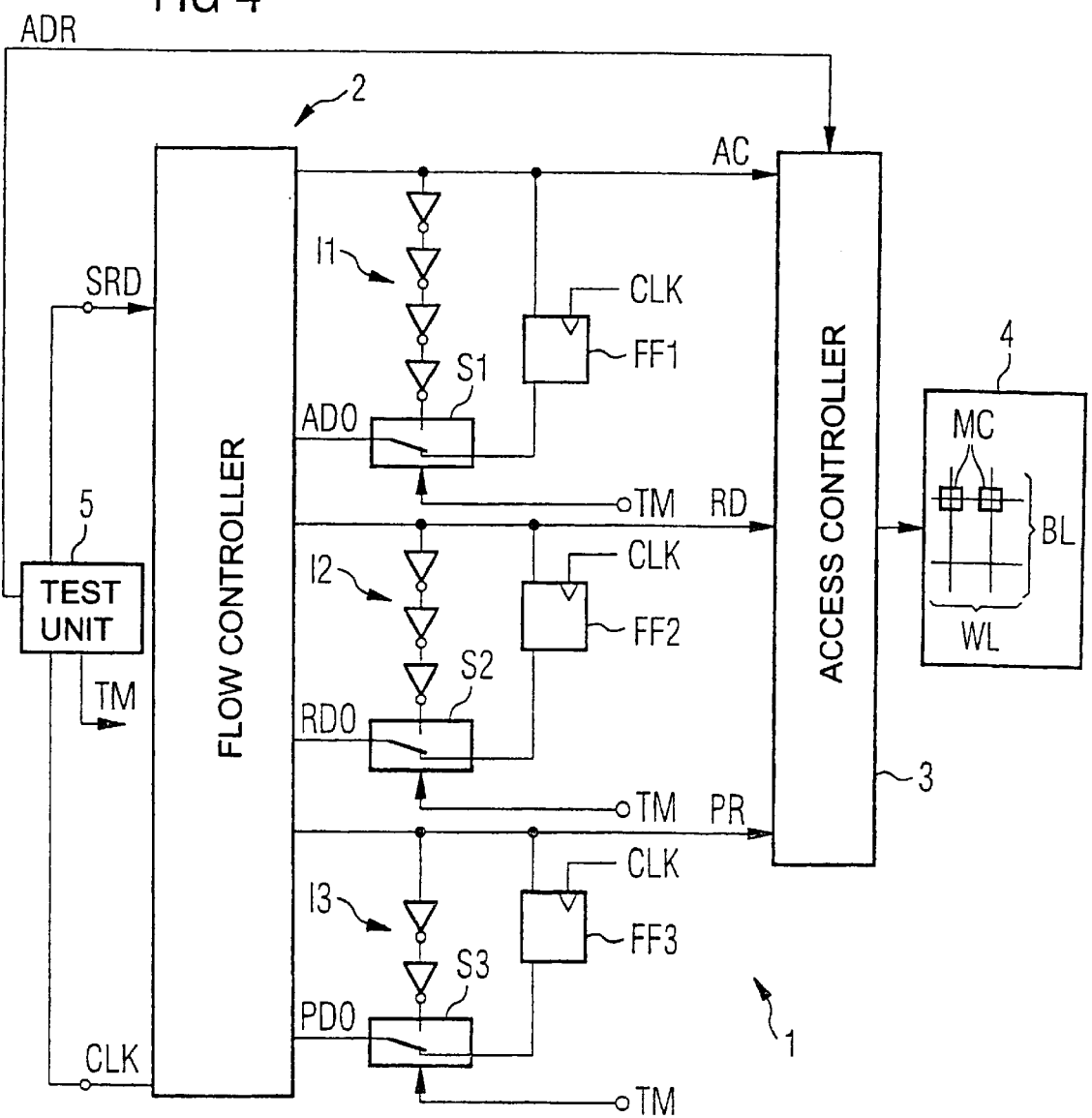

COMMAND CONTROLLER FOR AN INTEGRATED CIRCUIT MEMORY DEVICE AND TEST CIRCUITRY THEREOF

BACKGROUND OF THE INVENTION

Field of the Invention

The present invention relates to a circuit configuration having a flow controller that can be put into a plurality of states and which outputs a respective command, in a respective one of the states, to a circuit component to be controlled. The flow controller has at least one asynchronously operating delay circuit via which the flow controller moves from one of the states into the respective next state. The invention also relates to an integrated memory and to a test configuration having such a circuit configuration.

Integrated memories, for example in the form of DRAMs (Dynamic Random Access Memories), are operated in data processing systems and in this case are actuated by a microprocessor or memory controller, for example. From a certain size of the memory device upward, for example for a memory size of over 1 Mbit, all available DRAMs normally use a so-called "multiplex address scheme." Such a multiplex address scheme has the advantage that it is very well suited to the functionality of a DRAM.

In general, for memory access, first the word lines which are to be addressed and then the bit lines which are to be selected are activated in synchronicity with a clock signal. The address scheme thus involves row addresses being transmitted first and then corresponding column addresses. This selects those memory cells from which data are read and those memory cells to which data are written. Similarly, the microprocessor or memory controller transmits a plurality of single commands, for read access particularly in the form of a word line activation signal, a column access signal and, to complete memory access, a word line deactivation signal.

One drawback of such a functionality is, in particular, that a DRAM interface used for the purpose is not immediately aligned with a corresponding processor interface which communicates with fast "SRAM" memories. In contrast to DRAMs, SRAMs are very much smaller and faster and they are generally not operated in a multiplex address scheme as described. However, SRAMs have the drawback that they are considerably more expensive than DRAMs.

Efforts are therefore generally made to use DRAMs also for applications in which SRAM memories have been used previously. In order to be able to use a DRAM also instead of an SRAM, access commands are combined into a macro command which is then processed within one clock cycle. When the macro command has been applied, the single commands for controlling access in a flow controller which can be put into a plurality of states are generated out of sync with the clock signal, with a respective single command being output to the access controller in a respective one of the states. The duration of the individual commands is set using asynchronously operating delay circuits via which the flow controller moves from one of the states into the respective next state. This allows a DRAM to be actuated with a command set that is oriented to fast SRAM memories.

To establish the operational functionality or serviceability of an integrated memory, a memory that is to be checked is operated in a test configuration in which a test unit is connected to the memory, and the functionality of the memory is checked. Particularly for the purpose of checking the command sequence for memory access, it is advantageous and appropriate if the single commands run in sync with a clock, since normal test units operate in sync with a clock.

SUMMARY OF THE INVENTION

It is accordingly an object of the invention to provide a circuit configuration of the above-mentioned type which overcomes the disadvantages of the heretofore-known devices and methods of this general type and in which, in a test mode of the circuit configuration, for example, the commands are output in synchronized fashion.

With the foregoing and other objects in view there is provided, in accordance with the invention, a circuit configuration, comprising:

a flow controller enabled to assume a plurality of states and for outputting a respective command, in each of the states, to a circuit component to be controlled;

the flow controller having at least one asynchronously operating delay circuit, the flow controller moving from one state into a respectively next state via the delay circuit;

a further signal path connected in parallel with the delay circuit, the further signal path having a clock-controlled multivibrator; and a switch connected to alternatively operate the delay circuit and the further signal path.

In accordance with the invention, the delay circuit in the flow controller mentioned initially has a further signal path connected in parallel with it which has a clock-controlled multivibrator. In the novel circuit, the delay circuit and the further signal path can be operated alternatively using a switch. This allows, for example in a test mode of the circuit configuration, the commands output by the flow controller to be output by the flow controller in synchronized fashion. The invention then affords the advantage that the basically asynchronously operating flow controller, which thereby controls the command sequence, particularly in a normal mode, does not need to be modified. In addition, the additional circuit complexity is kept comparatively low by virtue of the provision of the multivibrator.

The invention can be used, in principle, in any type of circuit configuration which has a flow controller which can be put into a plurality of states and which outputs a respective command, in a respective one of the states, to a circuit component which is to be controlled. The invention thus allows the command sequence from a flow controller which operates asynchronously per se to be synchronized with a clock in a second operating state.

With the above and other objects in view there is also provided, in accordance with the invention, an integrated memory device that comprises a plurality of memory cells, an access controller for controlling an access to the memory cells, and a circuit configuration as outlined above. The flow controller is connected to output the commands to the access controller for controlling the access to the memory cells.

In other words, the invention can be used with particular advantage in an integrated memory in which a flow controller is connected, for the purpose of outputting commands, to an access controller for controlling access to memory cells in the memory. Such a memory is suitable, particularly in a normal mode, for controlling memory access using a command sequence oriented to fast SRAM memories, as described in more detail in the introduction. In addition, however, a memory in accordance with the invention allows, particularly for the purpose of testing the memory using a test unit operating in sync with a clock signal, the command sequence for memory access to be synchronized with the clock signal and hence to be rendered checkable by the test unit.

In accordance with an advantageous embodiment of the invention, the clock-controlled multivibrator is in the form of a clock-controlled D-type flip-flop circuit. The delay circuit has an input and an output, with an inverter chain being connected between the input and the output in one embodiment of the delay circuit. The further signal path is connected in parallel with the inverter chain between the input and the output. Alternatively, the delay circuit can have another configuration. It generally outputs the input signal at the output, delayed by a particular time.

With the above and other objects in view there is therefore provided, in accordance with the invention, a test configuration that comprises the above-outlined circuit configuration and a test unit connected to the circuit configuration. The further signal path is thereby connected via the switch, and the multivibrator is actuated by a clock signal of the test unit.

Other features which are considered as characteristic for the invention are set forth in the appended claims.

Although the invention is illustrated and described herein as embodied in a circuit configuration having a flow controller, integrated memory and test configuration having such a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagram of an exemplary embodiment of a delay circuit according to the invention;

FIG. 4 is a schematic diagram of an embodiment of an integrated memory according to the invention;

DESCRIPTION OF THE PREFERRED EMBODIMENTS

Figure 1:
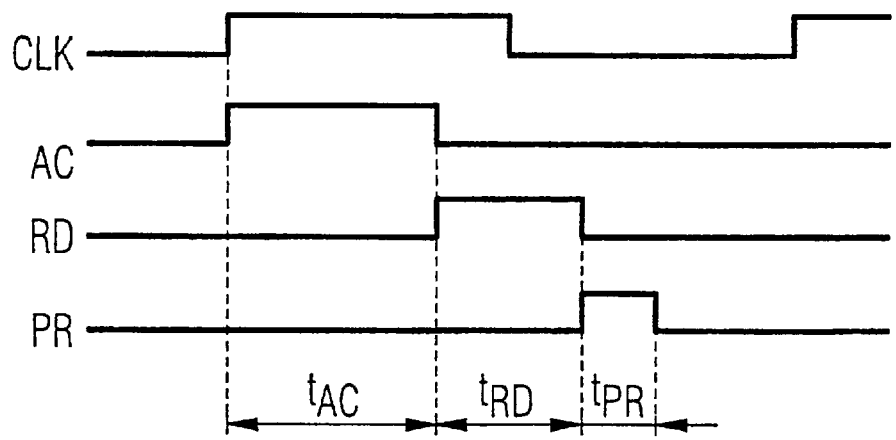
FIG. 1 is a signal timing diagram for the command sequence when a macro read command is applied to an integrated memory.

Referring now to the figures of the drawing in detail and first, particularly, to FIG. 1 thereof, there is illustrated a signal diagram that relates to the command sequence when a macro read command is applied to an integrated memory. The macro read command is transferred to a flow controller in the memory upon a rising clock edge of the clock signal CLK for the purpose of actuating an access controller. Using the access controller, a command sequence controls access to memory cells in the memory. In the example below, the macro read command is processed within one clock period of the clock signal CLK. This involves single commands in the form of a word line activation signal AC, a column access signal RD and a word line deactivation signal PR being produced asynchronously in succession from the macro read command. The duration of the individual commands is set using an asynchronously operating delay circuit. The word line activation signal AC is held in the activated state by way of a corresponding delay circuit for a time tAC, the column access signal RD for a time tRD and the word line deactivation signal PR for a time tPR.

Figure 2:
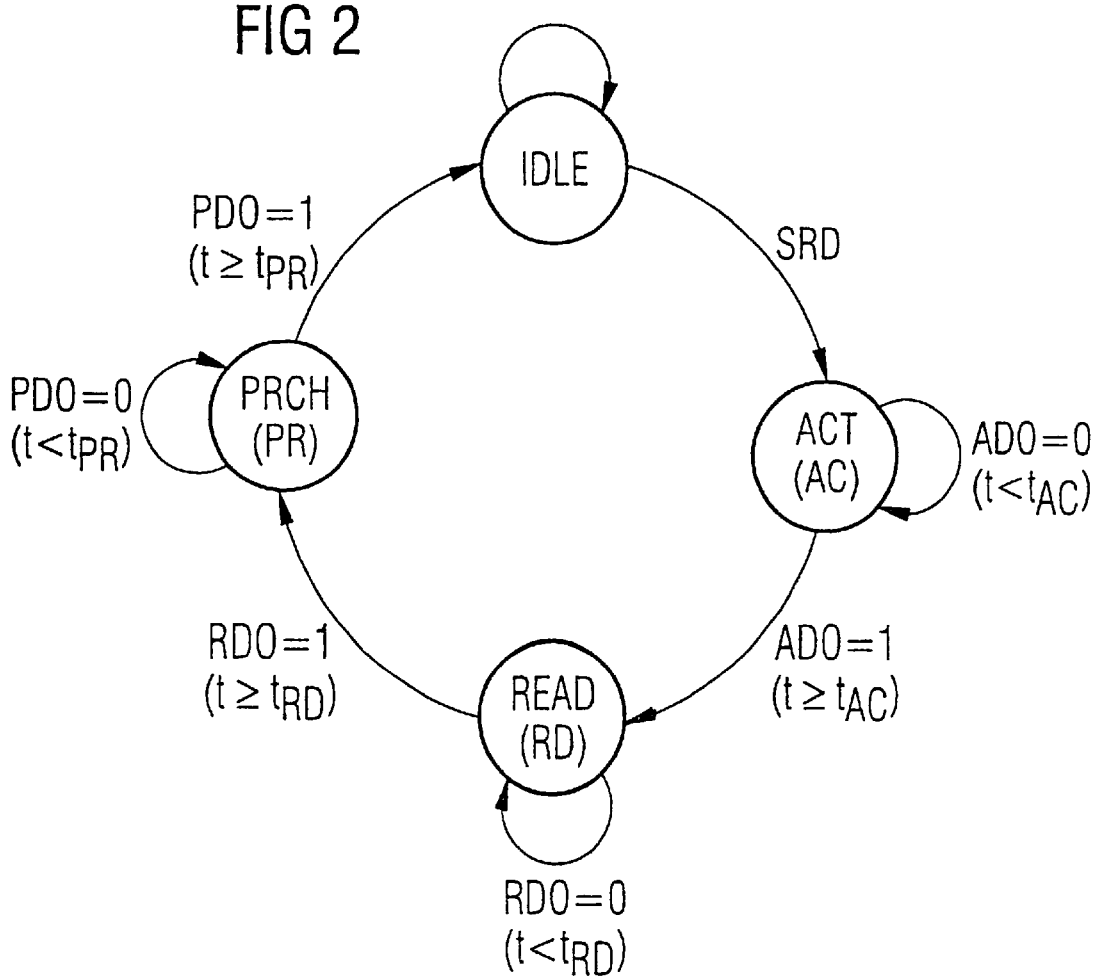
FIG. 2 is a state diagram for a flow controller in a memory for read access.

FIG. 2 shows a state diagram for a flow controller in a memory for read access. The flow controller can be put into a plurality of states ACT, READ and PRCH, with the flow controller activating the word line activation signal AC in the state ACT, the column access signal RD in the state READ, and the word line deactivation signal PR in the state PRCH. The macro read command SRD puts the flow controller into the state ACT. When the time tAC has elapsed, a delay circuit, illustrated in even more detail using the subsequent figures, produces the signal ADO=1, as a result of which the flow controller changes to the state READ. Similarly, when the time tRD has elapsed, a further delay circuit produces the signal RDO=1, as a result of which the flow controller changes to a state PRCH. Finally, when the time tPR has elapsed, a further delay circuit produces the signal PDO=1, as a result of which the flow controller changes back to the initial state IDLE. While no new event occurs, the flow controller remains in the idle state.

FIG. 3 shows an embodiment of a delay circuit in accordance with the invention. The delay circuit I has an input IN and an output OUT, with an inverter chain connected between the input and the output. The inverter chain has a further signal path connected in parallel with it between the input IN and the output OUT. The parallel signal path contains a clock-controlled multivibrator FF. The multivibrator is in the form of a clock-controlled D-type flip-flop circuit which is actuated by the clock signal CLK. The switch S, which is controlled by a test mode signal TM, can be used to operate the inverter chain I and the further signal path with the flip-flop FF alternatively. The delay circuit described is used, in particular, such that, in a first mode, for example a normal mode, an input signal at the input IN can be removed at the output OUT via the inverter chain I with a particular time delay. For a second mode, for example a test mode, the switch S is changed over using the test mode signal TM. The signal from the input IN, which is applied to the input of the flip-flop circuit FF, is transferred to the output of the flip-flop circuit FF upon the next clock edge of the clock signal CLK and can be removed at the output OUT.

FIG. 4 shows an embodiment of an integrated memory in accordance with the invention. The memory device 1 has a memory cell array 4 containing word lines WL and bit lines BL. Memory cells MC are arranged at crossover points between word lines WL and bit lines BL. The word lines WL are used for selecting memory cells MC using a corresponding selection transistor, while data signals in the memory cells MC are read via the bit lines BL in a known manner. An access controller 3 is used to control access to the memory cell array 4.

The memory cell access is controlled by the access controller 3 using commands AC, RD and PR which are made available by a flow controller 2. The flow controller 2 operates on the basis of the principle of the state diagram shown in FIG. 2 and can be put into the states ACT, READ and PRCH. In the state ACT the word line activation signal AC is forwarded to the access controller 3, in the state READ the column access signal RD is forwarded to the access controller 3 and in the state PRCH the word line deactivation signal PR is forwarded to the access controller 3. The flow controller 2 also has a connection for a macro read command SRD which initiates read access to the memory cell array 4. In addition, an address ADR is routed to the access controller 3.

The flow controller 2 has three asynchronously operating delay circuits I1 to I3 in the form of inverter chains, and also signal paths, connected in parallel therewith, containing respective clock-controlled D-type flip-flop circuits FF1 to FF3 which are actuated by the clock signal CLK. Respective switches S1 to S3 are used for changing over between the respective inverter chains I1 to I3 and the signal paths connected in parallel as appropriate. On the switches S1 to S3, it is possible to tap off the signals ADO, RDO and PDO, which have already been explained with reference to FIG. 2.

Figure 5:
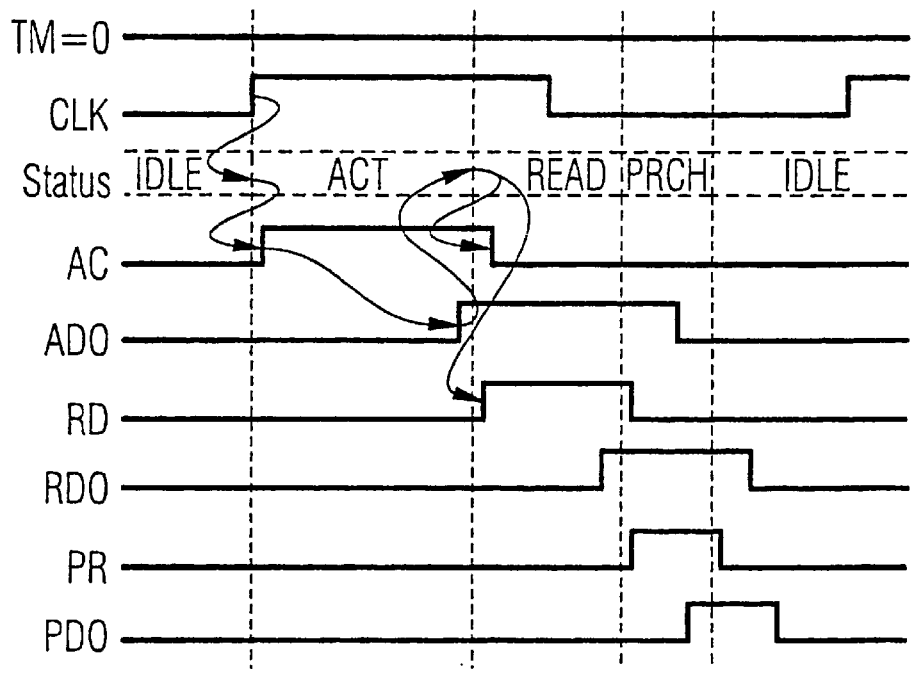
FIG. 5 is a signal diagram for the command sequence in a normal mode of the memory device shown in FIG. 4.

FIG. 5 shows a signal diagram for the command sequence for the memory shown in FIG. 4 in a normal mode of the memory. In this case, the command SRD and the address ADR and also the clock signal CLK are provided by a microprocessor or memory controller. The test mode signal TM has the state TM=0. The flow controller 2 runs through the states IDLE, ACT, READ and PRCH, as explained with reference to FIG. 2. Upon the rising edge of the clock signal CLK, the word line activation signal AC is activated and is delayed via the inverter chain I1. When the time tAC has elapsed, the signal ADO adopts the state ADO=1, as a result of which the flow controller 2 is put into the state READ. Accordingly, the signal AC is deactivated and the column access signal RD is activated. Similarly, the flow controller 2 moves, via the delay circuits I2 and I3, from the state READ into the state PRCH or IDLE.

Figure 6:
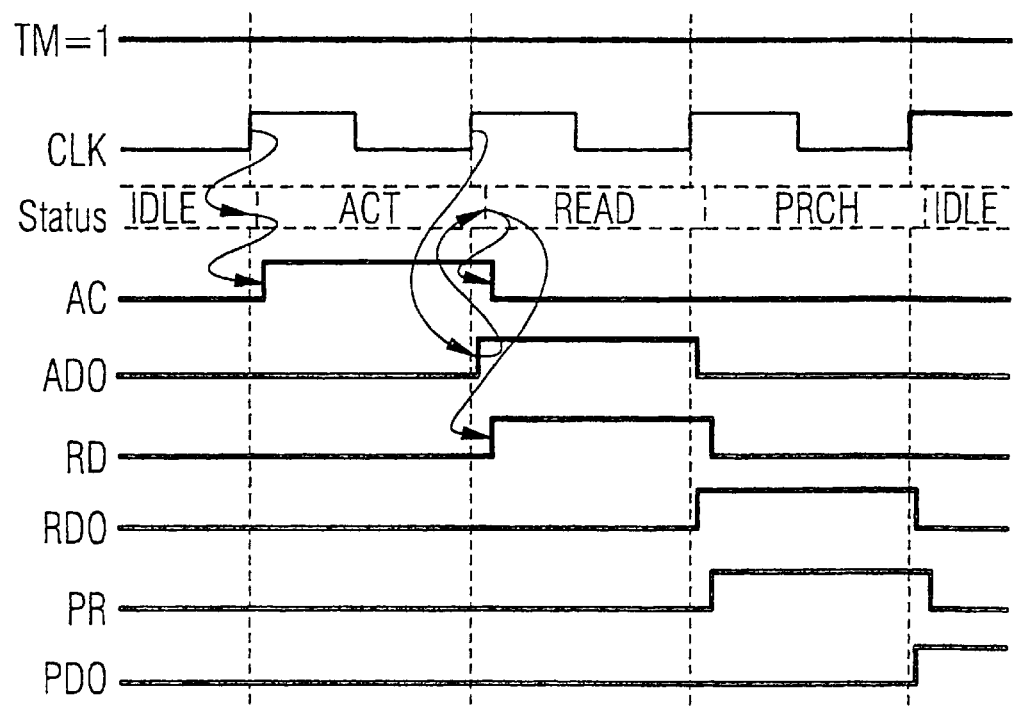
FIG. 6 is a signal diagram for the command sequence in a test mode of the memory device shown in FIG. 4.

FIG. 6 shows a signal diagram for the command sequence for the memory shown in FIG. 4 in a test mode. In this mode of operation, a test unit 5 has been connected to the memory 1 for the purpose of supplying the command SRD, the address ADR, the clock signal CLK and the test mode signal TM=1. This operating state is shown in FIG. 4. In this case, the signal paths which are connected in parallel with the delay circuits I1 to I3 and contain the flip-flop circuits FF1 to FF3 are connected via the switches S1 to S3. Upon the rising edge of the clock signal CLK, the flow controller changes from the state IDLE to the ACT state. This makes the word line activation signal AC active. The signal ADO is not activated until the next rising edge of the clock signal CLK. The flow controller 2 now changes from the state ACT to the READ state, which deactivates the signal AC and sets the column access signal RD. Upon the next rising edge of the clock signal CLK, the signal RDO becomes active and the flow controller changes over to the next state PRCH. The next state change proceeds in a similar manner.

The invention thus allows the command sequence for supplying the access controller 3 to run in synchronicity with the clock CLK, so that the functionality of read access can be checked cyclically by the test unit. This does not require the flow controller or its asynchronously operating delay circuits to be modified, but rather each delay circuit is extended merely by a flip-flop and a switch. The additional circuit complexity is thus low and easily manageable.

I claim:

1. A circuit configuration, comprising:
   a flow controller enabled to assume a plurality of states and for outputting a respective command, in each of the states, to a circuit component to be controlled;
   said flow controller having at least one asynchronously operating delay circuit, said flow controller moving from one state into a respectively next state via said delay circuit;
   a further signal path connected in parallel with said delay circuit, said further signal path having a clock-controlled multivibrator; and
   a switch connected to alternatively operate said delay circuit and said further signal path.

2. The circuit configuration according to claim 1, wherein said clock-controlled multivibrator is a clock-controlled D-type flip-flop circuit.

3. The circuit configuration according to claim 1, wherein said delay circuit has an input and an output, an inverter chain connected between said input and said output, and said further signal path is connected in parallel with said inverter chain between said input and said output.

4. An integrated memory device, comprising:
   a plurality of memory cells; an access controller for controlling an access to said memory cells; and
   a circuit configuration according to claim 1, with said flow controller connected to output the commands to said access controller for controlling the access to said memory cells.

5. The integrated memory device according to claim 4, wherein said flow controller includes a connection for receiving a macro command and an output for tapping off single commands, generated from the macro command, in a respective one of the states of said flow controller.

6. The integrated memory device according to claim 5, wherein said flow controller includes a connection for receiving a read command for reading data from said memory cells and an output for transmitting to said access controller a word line activation signal, generated from the read command, in a first state, a column access signal in a second state, and a word line deactivation signal in a third state of said flow controller.

7. The integrated memory device according to claim 4, which further comprises a connection for a test mode signal for actuating said switch.

8. A test configuration, comprising:
   a circuit configuration according to claim 1;
   a test unit connected to said circuit configuration; and
   wherein said further signal path is connected via said switch, and said multivibrator is actuated by a clock signal of said test unit.

* * * * *